United States Patent
Tan et al.

(10) Patent No.: US 7,502,405 B2
(45) Date of Patent: Mar. 10, 2009

(54) SEMICONDUCTOR SYSTEM HAVING A RING LASER FABRICATED BY EXPITAXIAL LAYER OVERGROWTH

(75) Inventors: Michael R. T. Tan, Menlo Park, CA (US); Scott W. Corzine, Sunnyvale, CA (US); David P. Bour, Cupertino, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 104 days.

(21) Appl. No.: 11/209,994

(22) Filed: Aug. 22, 2005

(65) Prior Publication Data

US 2007/0041419 A1 Feb. 22, 2007

(51) Int. Cl.
H01S 3/083 (2006.01)
H01S 5/00 (2006.01)
H01L 21/00 (2006.01)

(52) U.S. Cl. .............. 372/94; 372/50.124; 438/29; 438/31; 438/46; 438/47

(58) Field of Classification Search .......... 372/50.124, 372/94; 438/29, 31, 46, 47
See application file for complete search history.

(56) References Cited

U.S. PATENT DOCUMENTS

| | | | |
|---|---|---|---|
| 6,233,267 B1 | 5/2001 | Nurmikko et al. | |
| 6,282,226 B1 | 8/2001 | Furukawa | |
| 6,320,209 B1 | 11/2001 | Hata et al. | |
| 6,376,269 B1 | 4/2002 | Chen et al. | |
| 6,519,271 B2 * | 2/2003 | Kwon et al. | 372/46.01 |
| 6,535,537 B1 * | 3/2003 | Kinoshita | 372/50.11 |
| 6,600,765 B2 * | 7/2003 | Evans et al. | 372/50.1 |
| 6,807,216 B1 | 10/2004 | Hilliard | |
| 7,242,705 B2 | 7/2007 | Kneissl et al. | |
| 2002/0080842 A1 * | 6/2002 | An et al. | 372/92 |
| 2003/0026317 A1 | 2/2003 | Behfar | |
| 2005/0063445 A1 * | 3/2005 | Mizutani et al. | 372/94 |
| 2007/0081569 A1 * | 4/2007 | Kwon et al. | 372/43.01 |

FOREIGN PATENT DOCUMENTS

JP 2002310666 10/2002

OTHER PUBLICATIONS

B.Beaumont, S.Haffouz,andP.Gibart, "Magnesium induced changes in the selective growth of GaN by metal organic vapor phase epitaxy", Applied Physics Letters, vol. 72, No. 823, Feb. 1998, pp. 921-923.
K. Hiramatsu, K. Nishiyama, M, Onishi,H. Mizutani, M. Narukawa, A. Motogaito, H. Miyake, Y. Iyechika, and T. Maeda, "Fabrication and characterization of low defect density GaN using facet-controlled epitaxial lateral overgrowth (FACELO)", Journal of Crystal Growth, 221 (2000), pp. 316-326.

* cited by examiner

Primary Examiner—Kenneth A Parker
Assistant Examiner—Hrayr A. Sayadian

(57) ABSTRACT

The present invention provides a ring laser system comprising forming an optical core by an epitaxial layer overgrowth over an intermediate layer, forming multi-quantum wells adjacent to the optical core and forming an outer structure further comprising a total internal reflector, wherein forming photons within the multi-quantum wells further comprises circulating the photons within the ring laser structure comprising the outer structure, the multi-quantum wells, and the optical core.

10 Claims, 4 Drawing Sheets ial layer overgrowth (ELOG).

SEMICONDUCTOR SYSTEM HAVING A RING LASER FABRICATED BY EXPITAXIAL LAYER OVERGROWTH

BACKGROUND

The present invention relates generally to the fabrication of a ring laser, and more particularly to fabrication of a ring laser by epitaxial layer overgrowth (ELOG).

In general, a surface emitting laser can be classified into either a vertical cavity surface emitting laser (VCSEL) or a concentric circular grating surface emitting laser (CCGSEL), wherein the VCSEL includes a semiconductor substrate, such as gallium arsenide, and a VCSEL diode integrated thereon. The VCSEL diode includes a plurality of laterally extending horizontal layers, being arranged one on top of another, in a vertical axial stack including an active cavity region sandwiched between an n-type multiple-layer distributed Bragg reflector (DBR) mirror stack and a p-type multi-layer DBR mirror stack.

The active cavity region contains a plurality of laterally horizontally extending quantum wells. The holes and electrons injected into the quantum wells recombine to emit photons in a process called spontaneous emission. Such photons are emitted in all directions. Numerous reflected trips of such photons back and forth between the DBR mirror stacks ensure to induce stimulated and amplified axial emission, thereby generating an emission of stimulated and amplified axial lasing mode, i.e., VCSEL mode.

In VCSEL's that are fabricated with gallium-nitride(GaN) producing a reflective mirror that is useable for the laser is an issue. The VCSELs are grown on a sapphire substrate that is two to four inches in diameter. The substrate is difficult to scribe and dice causing device yield problems and increasing cost. Another drawback of the VCSEL is its high thermal resistance. Therefore, the high mean thermal density of the VCSEL has restricted applications; e.g., high density array, optical interconnects and signal processing. Since, further, the wavelength λ in the VCSEL mode increases linearly with temperature, the temperature of the active cavity region of the VCSEL must be maintained with negligible variations. Many laser products are in use today in printers, cameras, communication systems and security systems. Many more applications are possible, but the cost of the lasers is typically prohibitive and the supply is limited.

SUMMARY OF THE INVENTION

In accordance with the invention, a ring laser system is made by forming an optical core by an epitaxial layer overgrowth over an intermediate layer, forming multi-quantum wells adjacent to the optical core and forming an outer structure comprising a total internal reflector, wherein forming photons within the multi-quantum wells further comprises circulating the photons within a ring laser structure comprising the outer structure, the multi-quantum wells, and the optical core.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
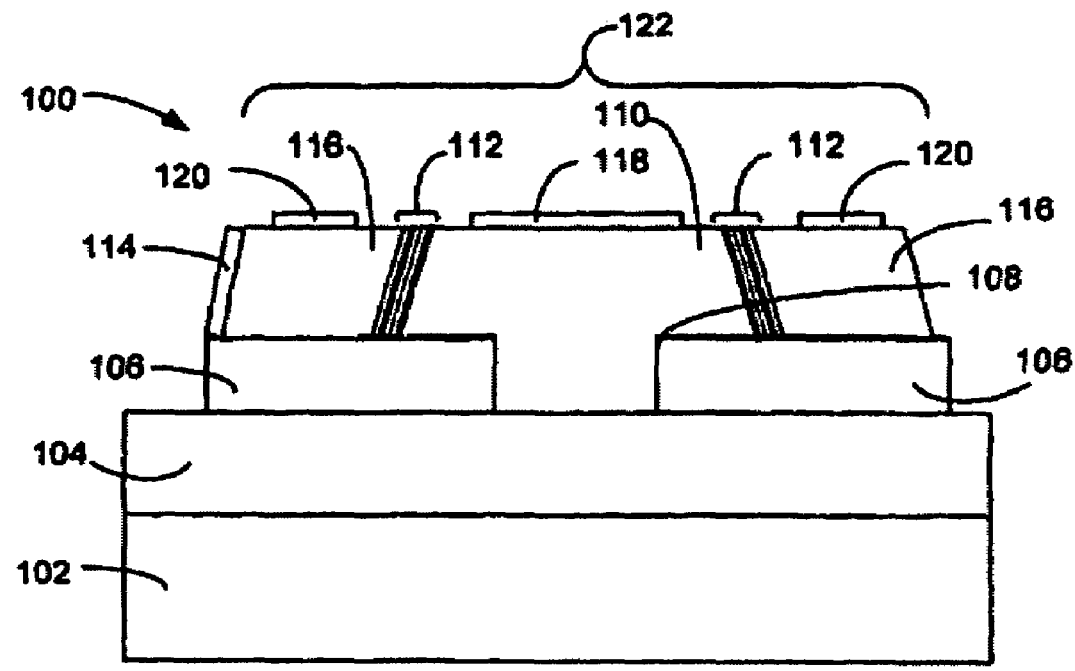
FIG. 1 shows a vertical cross-sectional view of a ring laser system according to one embodiment of the present invention.

In the following description, numerous specific details are given to provide a thorough understanding of the invention. However, it will be apparent that the invention may be practiced without these specific details. In order to avoid obscuring the present invention, some well-known process steps are not disclosed in detail. Likewise, the drawings showing embodiments of the device are semi-diagrammatic and not to scale and, particularly, some of the dimensions are for the clarity of presentation and are shown greatly exaggerated in the drawing FIGS. Similarly, although the sectional views in the drawings for ease of description show the ends of segments or layers as oriented in a particular direction, this arrangement in the FIGS. is arbitrary and is not intended to suggest that the delivery path should necessarily be in that particular direction. Generally, once a device is fabricated it can be operated in any orientation. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of a wafer upon which the ring lasers are formed regardless of the orientation of the wafer. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a vertical cross-sectional view of a ring laser system 100, in an embodiment of the present invention. The ring laser system 100 includes an $Al_2O_3$ substrate 102, a GaN buffer layer 104, a $SiO_2$ intermediate layer 106, including an epitaxial layer overgrowth (ELOG) opening 108, an optical core 110, composed of a photoactive semiconductor, such as n-GaN, in a lateral space over the $SiO_2$ intermediate layer 106, multi-quantum wells 112 (MQW), a discontinuity 114, an outer structure 116, of material such as p-GaN, an n-contact 118 and a p-contact 120. The GaN buffer layer 104 is grown by ELOG on the $Al_2O_3$ substrate 102. The $SiO_2$ intermediate layer 106 is deposited over the GaN buffer layer 104, patterned to form the ELOG opening 108. The ELOG opening 108 is in the form of a hexagonal or circular shape, but could be other geometric shapes as well. The epitaxial layer overgrowth of GaN naturally takes on a hexagonal pyramidal shape with a flat top when unrestricted.

The ELOG process continues as the optical core 110 is grown through the ELOG opening 108 and over the $SiO_2$ intermediate layer 106. The optical core 110 being formed is hexagonally shaped. Multi-quantum wells 112 are grown laterally on the sidewalls of the hexagonal shaped pyramid. Since perfect lateral growth is not achievable, the multi-quantum wells 112 grown along the top surface will be thinner and will therefore turn-on at a higher voltage than the thicker, laterally grown multi-quantum wells 112. An etch process may be used to remove the multi-quantum wells 112 grown on the top surface. The outer structure 116 is grown epitaxially around the multi-quantum wells 112. Thus, the optical cavity 122 or laser resonator is the hexagonal pyramid formed by the ELOG process and is comprised of the optical core 110, the multi-quantum wells 112, and the outer structure 116.

The spontaneous emission wavelength of the device is established by the thickness and composition of the layers in the multi-quantum wells 112, while the lasing wavelength is determined by the dimensions of the optical cavity 122. The optical mode formed is a result of the total internal reflection of light within the optical cavity 122, having a hexagonal shape. Only these resonant modes may participate in the lasing action of the laser.

The n-contact 118 is deposited on the top surface of the optical core 110 and the p-contact 120 is deposited on the top surface of the outer structure 116. The n-contact 118 and the p-contact 120 are used to make electrical connection to the ring laser device. Photon production starts when the p-contact 120 and the n-contact 118 are properly connected to an electrical source During the lasing function, photons escape from the optical cavity 122 through the discontinuity 114 formed on the outside of the outer structure 116. The position and shape of the discontinuity 114 can be varied to accommodate the mechanism used to adapt the ring laser to a fiber optic cable connection or lens structure.

The discontinuity 114 is chosen to be a material with lower refractive index than the outer structure 116. The discontinuity 114 facilitates an exit portal for the photons by reducing the reflectivity of the outer structure 116. The area of the outer structure 116 that is not covered by the discontinuity 114, acts as a total internal reflector keeping the photons circulating in the optical cavity 122 until they can encounter the discontinuity 114 and exit.

Figure 2:
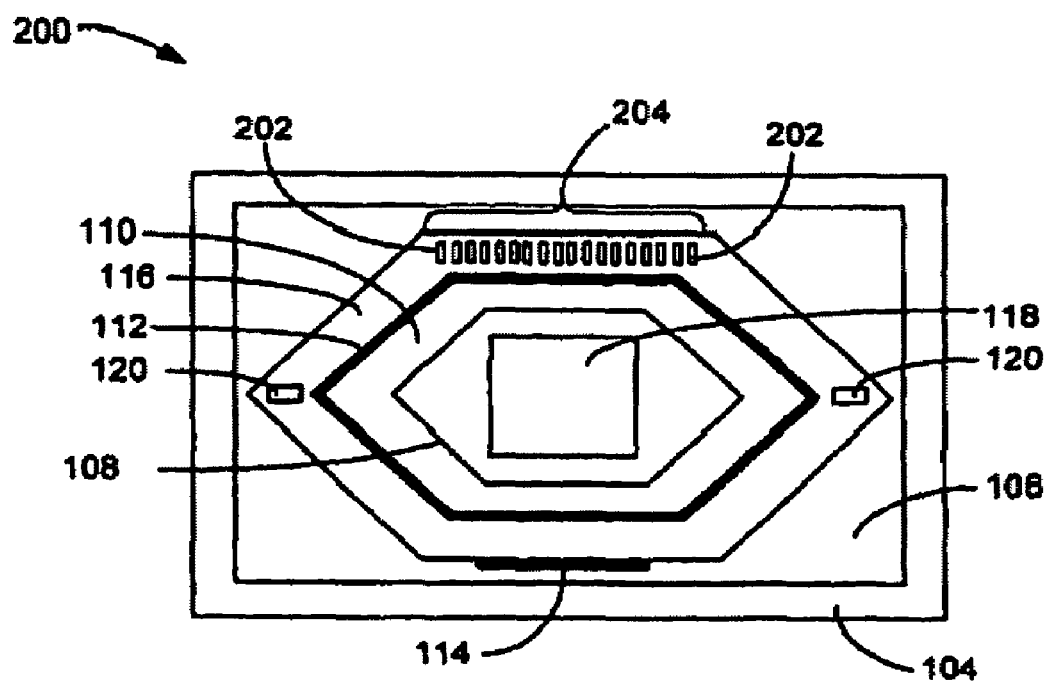
FIG. 2 is a top view of the ring laser system as shown in FIG. 1.

Referring now to FIG. 2, therein is shown a top view 200 of the ring laser system 100 as shown in FIG. 1. The top view 200 of the ring laser system 100 fabricated by epitaxial layer overgrowth comprises the GaN buffer layer 104, the $SiO_2$ intermediate layer 106 including the ELOG opening 108, the optical core 110, the multi quantum wells 112, the discontinuity 114, the outer structure 116, the n-contact 118, the p-contact 120, etched grooves 202 and a second order grating 204.

The optical core 110 was grown to fill the ELOG opening 108 and extend onto the $SiO_2$ intermediate layer 106. The multi-quantum wells 112 are grown by epitaxial layer overgrowth (ELOG), of a material such as InGaN, to surround the optical core 110. The outer structure 116 is also grown by ELOG of p-GaN. Metal contacts are added to allow electrical connection. The n-contact 118 is placed over the optical core 110 and the p-contact 120 is placed over the outer structure 116. The etched grooves 202, formed by etching, comprises the second order grating 204, wherein the second order grating 204 improves the extraction of light vertically from the plane of the ring.

The second order grating 204 changes the direction of photon circulation from the plane of the $SiO_2$ intermediate layer 106 to the vertical direction. The second order grating 204 is comprised of the etched grooves 202 etched into the surface of the outer structure 116 with the spacing between the peaks of the etched grooves 202 chosen to be equal to one wavelength of the light in the optical cavity 122. The photons circulating in the optical core 110 encounter the second order grating 204 and experience a first order diffraction of 90 degrees from the incident direction.

Figure 3:
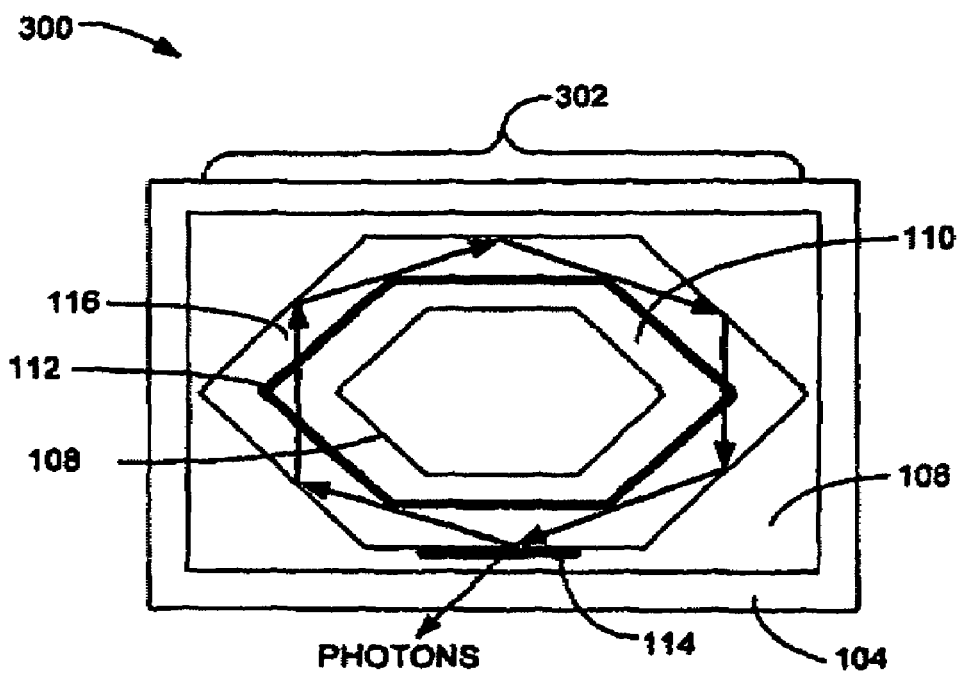
FIG. 3 is a schematic view of the ring laser system as shown in FIG. 1.

Referring now to FIG. 3, therein is shown a schematic view of the ring laser system 100 as shown in FIG. 1. The schematic view 300 of the ring laser system 100 includes the GaN buffer layer 104, the $SiO_2$ intermediate layer 106 including the ELOG opening 108, the optical core 110, the multi quantum wells 112, the discontinuity 114, the outer structure 116, and a ring laser structure 302. The ring laser structure 302 includes the optical core 110, the multi-quantum wells 112 and the outer structure 116.

The optical core 110 has the multi-quantum wells 112 adjacent to its perimeter. Each of the multi-quantum wells 112 becomes a source of photons during the lasing function. Arrows indicate one possible path for the photons to circulate. Due to the random nature of the photon generation, an infinite number of possible paths exist within the ring laser structure 302.

The difference in the index of refraction between the outer structure 116 and air causes a reflection of the photons back into the ring laser structure 302. Only photons that impinge on the air-semiconductor interface at an angle greater than the critical angle are totally reflected. These comprise the low loss modes of the laser resonator. Photons continue to circulate within the ring laser structure 302 until they encounter a less reflective path, such as the area of the outer structure 116 covered by the discontinuity 114. The discontinuity 114 is included within only one of the facets of the outer structure 116.

The discontinuity 114 can be a dielectric material on the outer structure 116. The dielectric material for this reduction in reflectivity is chosen to have an index of refraction lower than that of the outer structure 116 and higher than air. It slightly reduces the reflectivity of the outer structure 116 and allows an escape path for photons. The discontinuity 114 adhered to the outer structure 116 comprises providing the laser emission opening is in the form of a geometric shape. The shape of the discontinuity 114 can be matched to the external wave guide that will be used to couple the output of the ring laser structure 302 to an optical cable.

Alternatively, the discontinuity 114 may be introduced in the outer structure 116 to promote outcoupling of light from the laser mode. For example, a notch or diffraction grating may be etched on one of the facets, with the depth and shape of the notch or diffraction grating adjusted to accomplish the desired outcoupling fraction and emitted beam pattern.

The exposed surface, of the outer structure 116, acts as a reflector for the photons. The combination of all of the facets of the outer structure 116 forms a total internal reflector (TIR) for the ring laser structure 302. The top surface of the ring laser structure 302 and the surface of the $SiO_2$ intermediate layer 106 both allow full confinement of photons in the vertical dimension of the ring laser structure 302.

Figure 4:
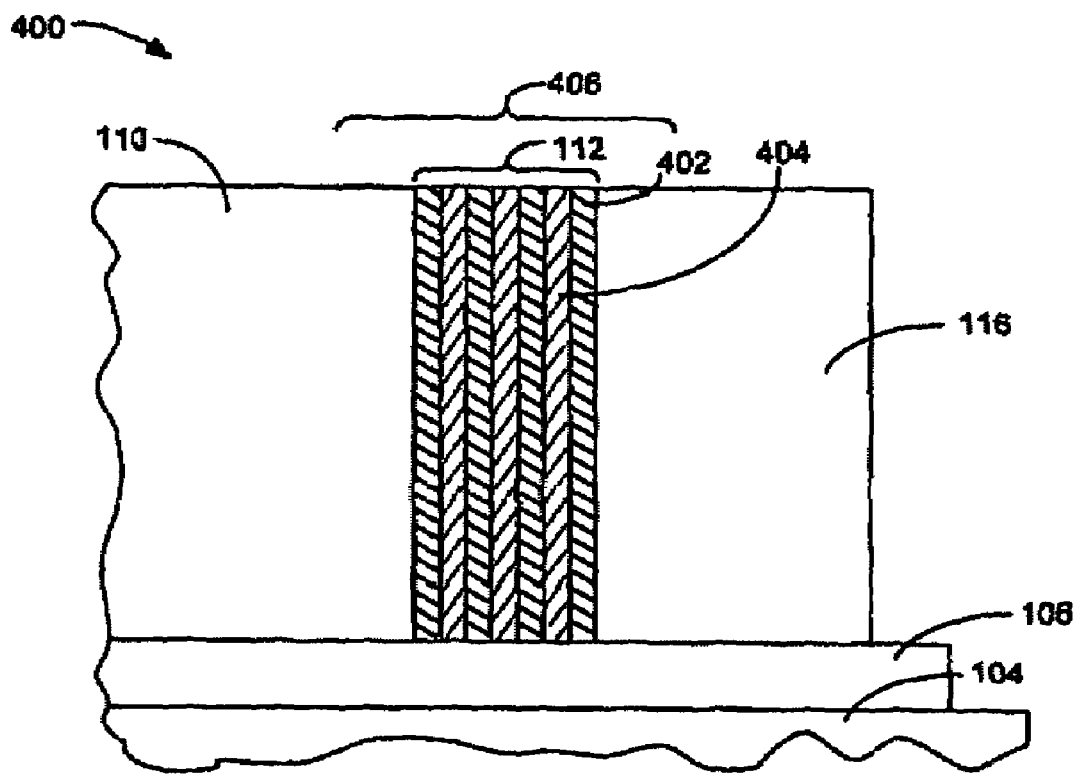
FIG. 4 is a cut away enlargement of the multi-quantum wells and the outer structure of the ring laser system as shown in FIG. 3.

Referring now to FIG. 4, therein is shown a cut away enlargement of the multi-quantum wells 112 and the outer structure 116 of the ring laser system 100 as shown in FIG. 3. The cut away enlargement 400 includes the GaN buffer layer 104, the $SiO_2$ intermediate layer 106 the optical core 110, the multi-quantum wells 112, the outer structure 116, barrier layers 402, quantum well layers 404 and a transverse N-I-P junction 406.

The multi-quantum wells 112 further comprise forming the barrier layers 402 and the quantum well layers 404 in an alternating vertical stripe pattern. For simplicity FIG. 4 shows only three of the quantum well layers 404, but more than three of the quantum well layers 404 are typically used. Each of the quantum well layers 404 is sandwiched by a pair of the barrier layers 402, so for n of the quantum well layers 404, there will always be n+1 of the barrier layers 402. In the current example the barrier layers 402 and the quantum well layers 404 are InGaN. It is also possible to use the n-doped and p-doped layers adjacent to the multi-quantum wells 112 as the barrier layers 402, but in this example the barrier layers 402 is explicitly added.

The multi-quantum wells 112 in combination with the optical core 110 and the outer structure 116, forms the transverse N-I-P junction 406 across the multi-quantum wells 112 for photon generation during the lasing function. The N connection is represented by the optical core 110, that is formed of N-GaN, the intrinsic layer connection, I, is formed by the multi-quantum wells 112 and the P connection is represented by the outer structure 116 that are formed of p-GaN.

The barrier layers 402 have a higher bandgap than the quantum well layers 404. When the transverse N-I-P junction 406 is forward biased, the quantum well layers 404 are the layers into which carriers, such as electrons and holes, are injected. The electrons and holes recombine in the quantum wells layers 404 and emit light at a wavelength determined by the material layers in the multi-quantum wells 112. The thickness, composition, and spacing of the barrier layers 402 and the quantum well layers 404 are chosen such that the spontaneous emission wavelength matches the resonant frequencies of the optical cavity 122.

Figure 5:
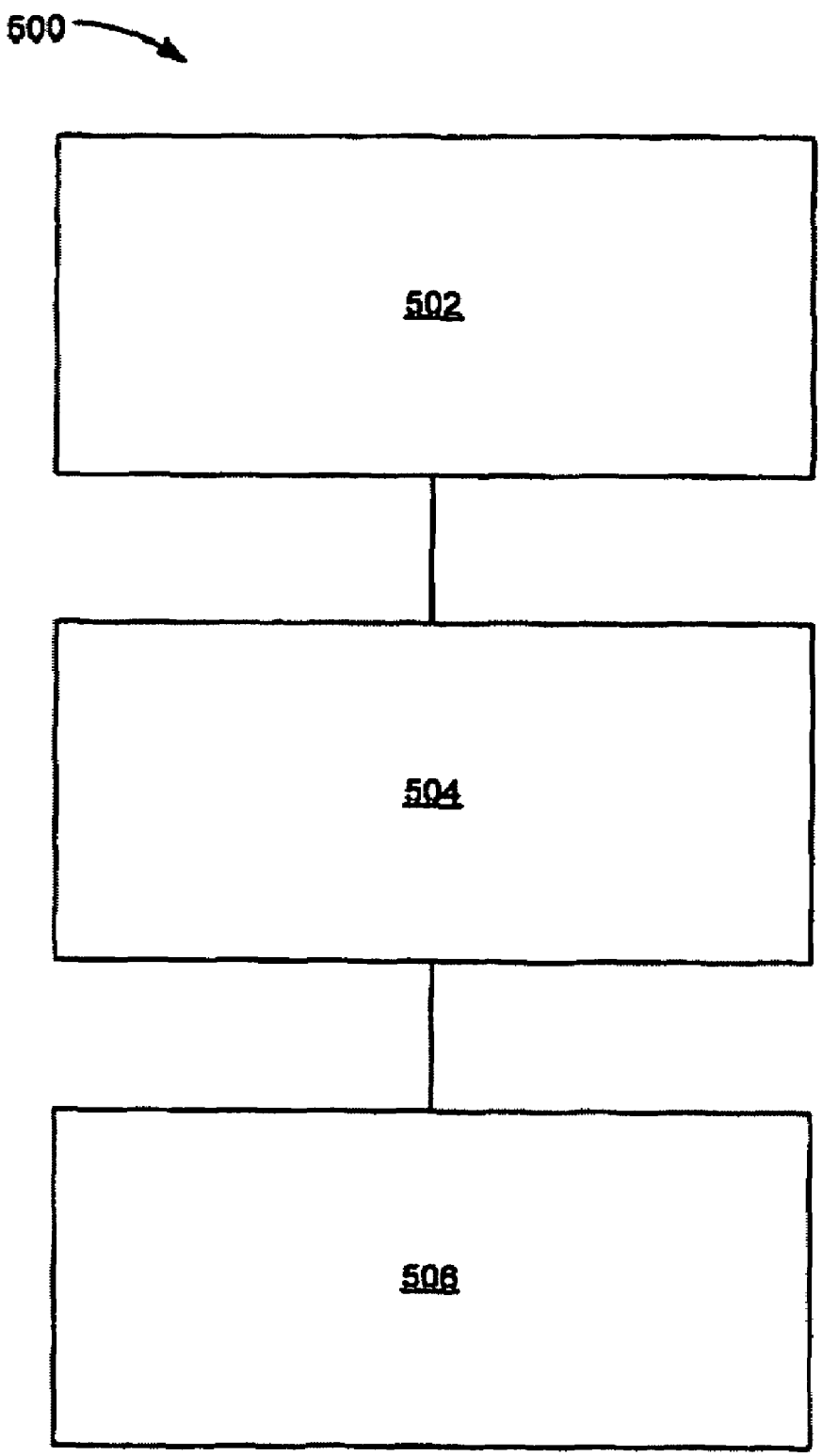
FIG. 5 is a flow chart of a one embodiment of fabricating a ring laser system by epitaxial layer overgrowth.

Referring now to FIG. 5, therein is shown a flow chart of a ring laser system 500 for fabricating the ring laser system 100 by epitaxial layer overgrowth in an embodiment of the present invention. The system 500 includes forming an optical core by an epitaxial layer overgrowth over a SiO$_2$ intermediate layer in a step 502; forming multi-quantum wells adjacent to the optical core in a step 504; and forming an outer structure comprising a total internal reflector, wherein forming photons within the multi-quantum wells further comprises circulating the photons within the ring laser structure comprising the outer structure, the multi-quantum wells and the optical core in a step 506.

In greater detail, a method to produce the ring laser system 100 fabricated by epitaxial layer overgrowth, according to an embodiment of the present invention, is performed as follows:

1. An optical core 110 is formed by an epitaxial layer overgrowth, over the SiO$_2$ intermediate layer 106 with the ELOG opening 108. (FIG. 1)
2. Multi-quantum wells 112 are formed by ELOG in an alternating vertical stripe pattern of the barrier layers 402 and the quantum well layers 404, of material such as InGaN, wherein the thickness and spacing of the quantum well layers is chosen such that the spontaneous emission wavelength matches the resonant frequencies of the optical cavity. (FIG. 1)
3. An outer structure 116 is grown by ELOG, of a material such as p-GaN, forming a total internal reflector, wherein the photons formed within the multi-quantum wells 112 circulate within the ring laser structure 302 until emitted from a portion of the ring laser structure 302 with an anti-reflection coating or diffraction grating (FIG. 3)

Figure 6:
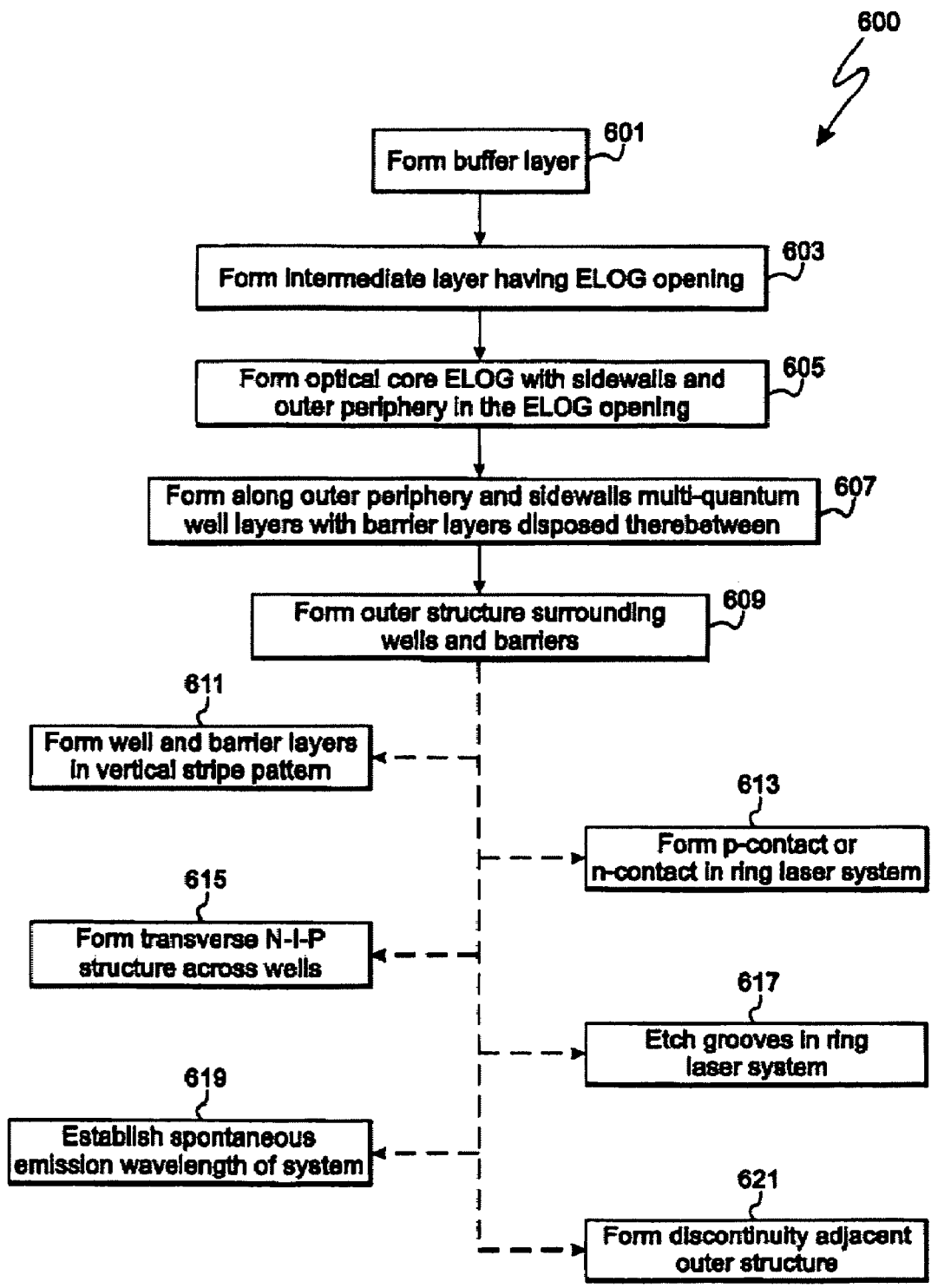
FIG. 6 is flow chart of another embodiment of fabricating a ring laser system by epitaxial overgrowth.

FIG. 6 shows an alternative embodiment of fabricating a ring laser system by epitaxial overgrowth. At step 601, a buffer layer is formed. At step 603, an intermediate layer having an ELOG opening disposed therein is formed. At step 605, an optical core ELOG with sidewalls and an outer periphery in the ELOG opening is formed. At step 607, multi-quantum well layers with barrier layers disposed therebetween are formed alone the outer periphery and the sidewalls. At step 609, an outer structure surrounding the wells and barriers is formed. Subsequent steps 611 through 621 may also be performed, according to the particular requirements at hand for the ring laser system that is to be fabricated.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of making a ring laser-system, comprising:
   forming a substantially planar and horizontal buffer layer having a first top surface;
   forming a substantially planar and horizontal intermediate layer atop the first top surface, the intermediate layer having a second top surface and a second bottom surface, the second bottom surface adjoining the first top surface, at least one epitaxial layer overgrowth (ELOG) opening being disposed through portions of the intermediate layer and extending between the second top surface and the second bottom surface;
   forming an optical core by ELOG in the ELOG opening over the first top surface and over the second top surface of the intermediate layer such that at least portions of the optical core extend vertically above the buffer layer and the intermediate layer, the vertical core comprising non-horizontal sidewalls disposed about an outer periphery thereof located above the second top surface;
   forming along the outer periphery and in contact with the sidewalls of the optical core a plurality of non-horizontal multi-quantum well layers and a plurality of non-horizontal barrier layers disposed therebetween; and
   forming an outer structure surrounding the plurality of non-horizontal multi-quantum wells and the plurality of non-horizontal barrier layers;
   wherein the the multi-quantum wells are configured to form photons, the ring laser system is configured to circulate the photons therein among one or more of the outer structure, the multi-quantum wells, and the optical cavity, and at least portions of the outer structure are configured to totally internally reflect the photons.

2. The method of claim 1 wherein forming the multi-quantum wells further comprises forming barrier layers and quantum well layers in an alternating vertical stripe pattern surrounding the optical core.

3. The method of claim 1, further comprising forming a transverse N-I-P structure across the multi-quantum wells, the N-I-P structure being configured to generate the photons during a lasing function.

4. The method of claim 1, further comprising establishing a spontaneous emission wavelength of the laser ring system in accordance with a horizontal thickness, composition, and spacing of the quantum well layers, wherein the spontaneous emission wavelength matches at least one resonant frequency of the optical cavity.

5. The method of claim 1, further comprising forming at least one of a p-contact and an n-contact on the ring laser system.

6. The method of claim 1, further comprising forming the n-contact over the optical core and forming the p-contact over the outer structure.

7. The method of claim 1, further comprising etching grooves in the ring laser structure to form a second order grating.

8. The method of claim 7, further comprising etching the grooves in the outer structure.

9. The method of claim 1, further comprising forming a discontinuity adjacent a portion of the outer structure.

10. The method of claim 9, further comprising forming the discontinuity and the outer structure such that a first index of refraction of the discontinuity is less than a second index of refraction of the outer structure.

* * * * *

UNITED STATES PATENT AND TRADEMARK OFFICE
CERTIFICATE OF CORRECTION

PATENT NO. : 7,502,405 B2  Page 1 of 1
APPLICATION NO. : 11/209994
DATED : March 10, 2009
INVENTOR(S) : Michael R. T. Tan, David P. Bour and Scott W. Corzine It is certified that error appears in the above-identified patent and that said Letters Patent is hereby corrected as shown below:

Title Page, Item (54) (Title), Line 2, delete "EXPITAXIAL" and insert --EPITAXIAL--.

Column 1, Line 2, delete "EXPITAXIAL" and insert --EPITAXIAL--.

Column 6, Line 54 (approx.), Claim 1, after "wherein" delete "the".

Signed and Sealed this
Fourth Day of January, 2011

David J. Kappos
*Director of the United States Patent and Trademark Office*